(12) United States Patent
Otake

(10) Patent No.: US 7,279,745 B2
(45) Date of Patent: Oct. 9, 2007

(54) SEMICONDUCTOR DEVICE

(75) Inventor: Seiji Otake, Saitama (JP)

(73) Assignee: Sanyo Electric Co., Ltd., Osaka (JP)

( * ) Notice: Subject to any disclaimer, the term of this patent is extended or adjusted under 35 U.S.C. 154(b) by 5 days.

(21) Appl. No.: 11/391,163

(22) Filed: Mar. 27, 2006

(65) Prior Publication Data

US 2006/0220115 A1    Oct. 5, 2006

(30) Foreign Application Priority Data

Mar. 30, 2005    (JP)    ............................. 2005-098967

(51) Int. Cl.
*H01L 29/76*    (2006.01)
(52) U.S. Cl. ................. 257/335; 257/336; 257/E29.255
(58) Field of Classification Search ................. 257/327, 257/335, 336, 337, 342, E29.255
See application file for complete search history.

(56) References Cited

U.S. PATENT DOCUMENTS 5,191,401 A * 3/1993 Shirai et al. ................ 257/328
5,811,850 A * 9/1998 Smayling et al. ........... 257/335
6,288,424 B1 * 9/2001 Ludikhuize ................. 257/335
6,927,442 B2 * 8/2005 Kaneko et al. .............. 257/299
2006/0186507 A1 * 8/2006 Kanda et al. ................ 257/491

FOREIGN PATENT DOCUMENTS

JP    2002-314065    10/2002
JP    2004-104141    4/2004

* cited by examiner

*Primary Examiner*—T. N. Quach
(74) *Attorney, Agent, or Firm*—Fish & Richardson P.C.

(57) ABSTRACT

In a semiconductor device of the present invention, an N-type epitaxial layer 2 is deposited on a P-type substrate 1. In the epitaxial layer 2, a P-type diffusion layer 5 to be used as a back gate region is formed. An N-type diffusion layer 8 to be used as a drain region is formed so as to surround the P-type diffusion layer 5. The P-type diffusion layer 5 and the N-type diffusion layer 8 partially overlap with each other. By use of a structure described above, a distance between a drain and a source is shortened. Thus, an ON resistance value can be reduced. Moreover, since a concentration gradient can be generated in the drain region, withstand pressure characteristics can be maintained while reducing an element formation region.

4 Claims, 3 Drawing Sheets

SEMICONDUCTOR DEVICE

BACKGROUND OF THE INVENTION

Priority is claimed to Japanese Patent Application Number JP2005-098967 filed on Mar. 30, 2005, the disclosure of which is incorporated herein by reference in its entirety.

1. Field of the Invention

The present invention relates to a semiconductor device which reduces an ON resistance value and realizes a large current by use of a structure of a drain region.

2. Description of the Related Art

As a conventional semiconductor device, the following technology has been known. For example, in a CMOS transistor, a P-type well region and an N-type well region are formed on a silicon substrate. In the P-type well region, an N-channel MOS transistor is formed. In the N-type well region, a P-channel MOS transistor is formed. For example, in the N-channel MOS transistor, source and drain regions having an LDD structure are formed in the P-type well region. In this event, the source and drain regions are formed by ion-implanting N-type impurities into the P-type well region formed on the silicon substrate. This technology is described for instance in Japanese Patent Application Publication No. 2004-140404.

Moreover, as a conventional semiconductor device, the following technology has been known. For example, in an N-channel MOS semiconductor device, an N-type epitaxial layer is deposited on a P-type single crystal silicon substrate. In the N-type epitaxial layer, a P-type well region is formed. In the P-type well region, an N-type source region is formed. The P-type well region is formed so as to extend to a part below a gate electrode on the N-type epitaxial layer. In the N-type epitaxial layer, an N-type drain region is formed in the vicinity of the P-type well region. Moreover, a gate oxide film is formed to be thick on the drain region side and to be thin on the source region side. This structure of the gate oxide film prevents a variation in characteristics of a silicon oxide film due to a high electric field on the drain region side. This technology is described for instance in Japanese Patent Application Publication No. 2002-314065.

As described above, in the conventional semiconductor device, the N-type source and drain regions are formed in the P-type well region in the N-channel MOS transistor of the CMOS transistor. Accordingly, an impurity concentration of the P-type well region and an impurity concentration of the N-type source and drain regions offset each other. Thus, it is difficult to obtain desired impurity concentrations. In the case where the N-type source and drain regions are set to be high-concentration impurity regions, a formation region of a depletion layer is reduced. Thus, there arises a problem that a withstand pressure of the MOS transistor is deteriorated. Moreover, in the case where the impurity concentration of the P-type well region is set low, the formation region of the depletion layer on a channel side is increased. Thus, there arises a problem that a formation region of the MOS transistor is increased.

Moreover, in the conventional semiconductor device, the gate oxide film may be formed to be thick on the drain region side and to be thin on the source region side in the N-channel MOS transistor. In this case, the drain region is formed so as to extend to a part below a gate electrode the thick gate oxide film. Moreover, in the P-type well region, a channel region is formed so as to be distant from the drain region. By adopting the structure described above, the P-type well region and the drain region are formed to be distant from each other, and a current path is increased in length. Thus, there arises a problem that an ON resistance value is increased. Furthermore, by forming the gate oxide film so as to vary in thickness, a manufacturing process is complicated. Thus, there arises a problem that the manufacturing costs.

SUMMARY OF THE INVENTION

The present invention was taken into consideration for the respective circumstances described above. The present invention provides a semiconductor device that includes a one conductivity type semiconductor substrate, an opposite conductivity type epitaxial layer laminated on the semiconductor substrate, a gate oxide film and a gate electrode, which are formed on the epitaxial layer, an opposite conductivity type buried diffusion layer formed across the semiconductor substrate and the epitaxial layer, a one conductivity type back gate diffusion layer which is formed in the epitaxial layer and overlaps with the buried diffusion layer at a bottom of the back gate diffusion layer, an opposite conductivity type drain diffusion layer which is formed in the epitaxial layer, at least partially overlaps with the back gate diffusion layer, and allows the overlapping region to be an opposite conductivity type diffusion region, an opposite conductivity type source diffusion layer formed in the back gate diffusion layer, a drain electrode connected to the drain diffusion layer, and a source electrode connected to the source diffusion layer. Therefore, in the present invention, the one conductivity type back gate diffusion layer to be a channel formation region and the opposite conductivity type drain diffusion layer are formed while partially overlapping with each other in the below of the gate electrode. By use of the structure described above, a distance between a drain and a source is shortened. Thus, an ON resistance value can be reduced.

Moreover, the present invention has the drain diffusion layer which is circularly formed so as to surround the back gate diffusion layer. Therefore, in the present invention, the drain diffusion layer is circularly formed so as to surround the back gate diffusion layer. By use of the structure described above, a current capacity can be improved. Moreover, since the drain diffusion layer can be efficiently disposed, an element formation region can be reduced.

Moreover, the present invention has a drain contact diffusion layer which is circularly formed in the drain diffusion layer. Therefore, in the present invention, while the element formation region is reduced, electric field relaxation can be maintained by a concentration gradient in the drain diffusion layer.

Moreover, the present invention has a one conductivity type back gate contact diffusion layer which is formed in the back gate diffusion layer and positioned in the vicinity of the source diffusion layer. Moreover, the source electrode is connected to the source diffusion layer and the back gate contact diffusion layer. Therefore, in the present invention, the source electrode is in contact with both of the source diffusion layer and the back gate contact diffusion layer. By use of the structure described above, the element formation region can be reduced.

DESCRIPTION OF THE EMBODIMENTS

Figure 1:
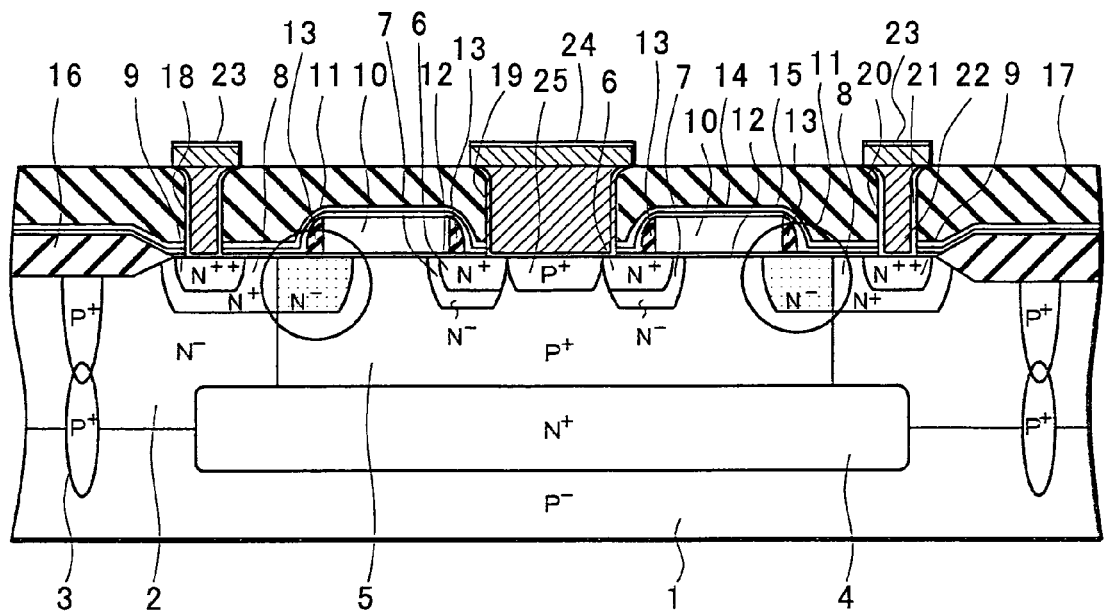
FIG. 1 is a cross-sectional view showing a semiconductor device according to an embodiment of the present invention.
Figure 2:
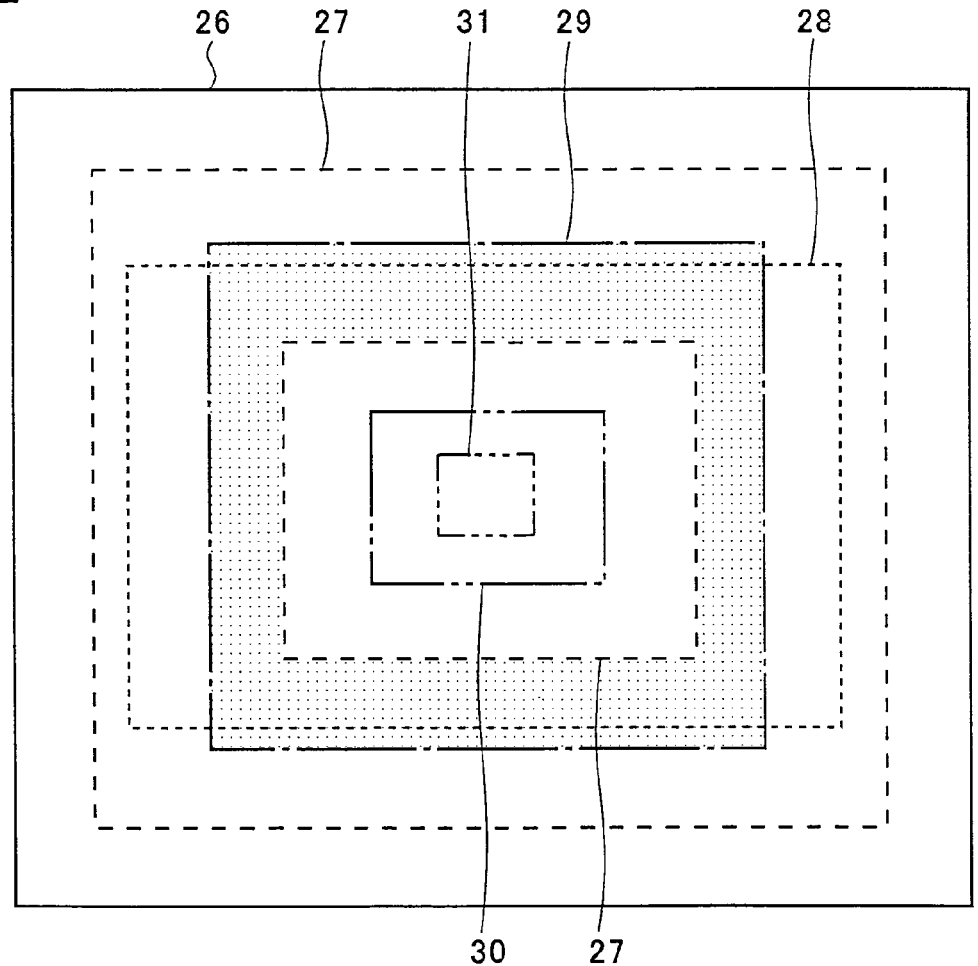
FIG. 2 is a top view showing the semiconductor device according to the embodiment of the present invention.

With reference to FIGS. 1 and 2, a semiconductor device according to an embodiment of the present invention will be described in detail below. FIG. 1 is a cross-sectional view showing the semiconductor device of this embodiment. FIG. 2 is a top view showing the semiconductor device of this embodiment.

As shown in FIG. 1, an N-channel MOS transistor mainly includes: a P-type single crystal silicon substrate 1; an N-type epitaxial layer 2; a P-type isolation region 3; an N-type buried diffusion layer 4; a P-type diffusion layer 5 to be used as a back gate region; N-type diffusion layers 6 and 7 to be used as a source region; N-type diffusion layers 8 and 9 to be used as a drain region; and a gate electrode 10.

The N-type epitaxial layer 2 is formed on the P-type single crystal silicon substrate 1. Note that, although description is given of the case where one epitaxial layer 2 is formed on the substrate 1 in this embodiment, the embodiment of the present invention is not limited to this case. For example, only the substrate may be used or a plurality of epitaxial layers may be laminated on the substrate. Moreover, the substrate may be an N-type single crystal silicon substrate or a compound semiconductor substrate.

The P-type isolation region 3 is formed by connecting a P-type buried diffusion layer, which is vertically diffused from a surface of the substrate 1, to a P-type diffusion layer, which is diffused from a surface of the epitaxial layer 2. The isolation region 3 sections the substrate 1 and the epitaxial layer 2, and a plurality of island regions are formed in the substrate 1 and the epitaxial layer 2.

The N-type buried diffusion layer 4 is formed across the substrate 1 and the epitaxial layer 2. By use of the structure described above, the P-type substrate 1 and the P-type diffusion layer 5 are electrically isolated from each other by the N-type buried diffusion layer 4. Accordingly, it is possible to apply a drain voltage, for example, to the buried diffusion layer 4 and to apply individual potentials to the P-type substrate 1 and the P-type diffusion layer 5.

The P-type diffusion layer 5 is formed in the epitaxial layer 2. The P-type diffusion layer 5 is formed by ion-implanting P-type impurities, for example, boron (B) from the surface of the epitaxial layer 2 by a dose of $1.0\times10^{12}$ to $1.0\times10^{14}/cm^2$ at an acceleration voltage of 140 to 170 keV. The P-type diffusion layer 5 is formed so as to at least partially overlap with the N-type buried diffusion layer 4 in a deep portion thereof.

The N-type diffusion layers 6 and 7 are formed in the P-type diffusion layer 5. The N-type diffusion layers 6 and 7 are used as the source region. The N-type diffusion layer 6 is formed while overlapping with a formation region of the N-type diffusion layer 7. Accordingly, an impurity concentration of the N-type diffusion layer 6 is set higher than that of the N-type diffusion layer 7. Thus, reduction in contact resistance and the like are realized.

The N-type diffusion layers 8 and 9 are formed in the epitaxial layer 2. The N-type diffusion layers 8 and 9 are used as the drain region. As surrounded by a circle 11 and indicated by hatching, the N-type diffusion layer 8 is formed while partially overlapping with the P-type diffusion layer 5. The N-type diffusion layer 8 is formed by ion-implanting N-type impurities, for example, phosphorus (P) from the surface of the epitaxial layer 2 by a dose of $1.0\times10^{14}$ to $1.0\times10^{16}/cm^2$ at an acceleration voltage of 30 to 60 keV. Moreover, in a region where the P-type diffusion layer 5 and the N-type diffusion layer 8 overlap with each other, an N-type impurity concentration and a P-type impurity concentration are compensated for each other. Thus, the region becomes a low-concentration N-type diffusion region. Meanwhile, the N-type diffusion layer 9 is formed while overlapping with a formation region of the N-type diffusion layer 8. Accordingly, an impurity concentration of the N-type diffusion layer 9 is set higher than that of the N-type diffusion layer 8.

Specifically, the drain region has a concentration gradient from the N-type diffusion layer 9 toward the N-type diffusion layer 8 which overlaps with the P-type diffusion layer 5. Accordingly, the region where the P-type diffusion layer 5 and the N-type diffusion layer 8 overlap with each other is formed as a low-concentration N-type region. By use of the structure described above, the drain region can be efficiently disposed on the source region side. Thus, it is possible to shorten a current path between a drain and a source and to reduce an ON resistance value. Moreover, by allowing the P-type diffusion layer 5 and the N-type diffusion layer 8 to overlap with each other, an element formation region can be reduced.

Meanwhile, the overlapping region, which is surrounded by the circle 11 and indicated by hatching, is used as the drain region and disposed to the below of the gate electrode 10. The structure described above makes it possible to achieve electric field relaxation by use of the low-concentration region that is the drain region with respect to a vertical electric field from the gate electrode. Moreover, a channel direction electric field from the source region toward the drain region reaches its maximum at an end of the drain region. With respect to the channel direction electric field, similarly, the structure described above makes it possible to achieve the electric field relaxation by use of the low-concentration region that is the drain region. Specifically, although the element formation region is reduced, the electric field relaxation in the drain region can be achieved, and withstand pressure characteristics of the MOS transistor can be maintained.

The gate electrode 10 is formed on a gate oxide film 12. The gate electrode 10 is formed of a polysilicon film. On a sidewall of the gate electrode 10, a sidewall 13 is formed. On the gate electrode 10, a TEOS (Tetra-Ethyl-Orso-Silicate) film 14 and a silicon nitride film 15 are formed.

A LOCOS (Local Oxidation of Silicon) oxide film 16 is formed in the epitaxial layer 2. A flat portion of the LOCOS oxide film 16 has a thickness of, for example, about 3000 to 5000 Å.

An insulating layer 17 is formed on the epitaxial layer 2. The insulating layer 17 is formed by depositing a BPSG (Boron Phospho Silicate Glass) film, a SOG (Spin On Glass) film and the like. Moreover, by use of a publicly known photolithography technology, contact holes 18 to 20 are formed in the insulating layer 17 by dry etching using $CHF_3+O_2$ gas, for example.

The contact holes 18 to 20 are filled with a barrier metal film 21 and a tungsten (W) film 22. On a surface of the tungsten film 22, an aluminum copper (AlCu) film and the barrier metal film are selectively formed. Thus, a drain electrode 23 and a source electrode 24 are formed. In the P-type diffusion layer 5, a P-type diffusion layer 25 is formed as a back gate contact region. The source electrode 24 is connected to the N-type diffusion layer 6 to be the source region and to the P-type diffusion layer 25. By use of the structure described above, it is not required to individually form back gate electrodes, and miniaturization of elements can be realized. Note that, although the cross-sectional view of FIG. 1 shows no wiring layer for the gate electrode 10, the gate electrode 10 is connected to the wiring layer in other regions.

As shown in FIG. 2, from the outmost line, a solid line 26 corresponds to the P-type isolation region 3, a dotted line 27 corresponds to the N-type diffusion layer 8, a dotted line 28 corresponds to the N-type buried diffusion layer 4, a dashed line 29 corresponds to the P-type diffusion layer 5, a two-dot chain line 30 corresponds to the N-type diffusion layer 6, and a three-dot chain line 31 corresponds to the P-type diffusion layer 25.

As shown in FIG. 2, the N-type diffusion layer 8 to be the drain region is circularly formed around the P-type diffusion layer 5. As described above, a region indicated by hatching is the region where the P-type diffusion layer 5 and the N-type diffusion layer 8 overlap with each other and is set to be a low-concentration N-type diffusion region. By use of the structure described above, the drain region can be efficiently disposed. Moreover, in the P-type diffusion layer 5, the P-type diffusion layer 25 as the back gate contact region is formed so as to be surrounded by the N-type diffusion layer 6. By use of the structure described above, the back gate contact region can be formed at one place and the source electrode can also doubles as the back gate electrode. Specifically, in this embodiment, the element formation region can be reduced while improving a current capacity.

Note that, in this embodiment, the description has been given of the case where the drain region is circularly formed around the back gate region. However, the embodiment of the present invention is not limited to the above case. For example, a plurality of sectioned drain regions may be disposed around the back gate region such that a drain region is disposed on an opposed side. Besides the above, various changes can be made without departing from the scope of the embodiment of the present invention.

Figure 3:
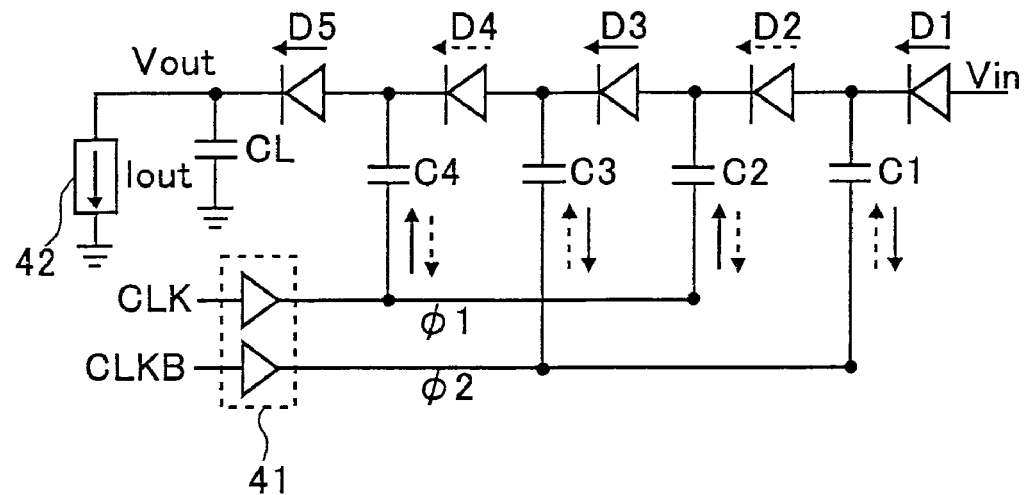
FIG. 3 is a circuit diagram of a charge pump device according to a conventional embodiment.
Figure 4:
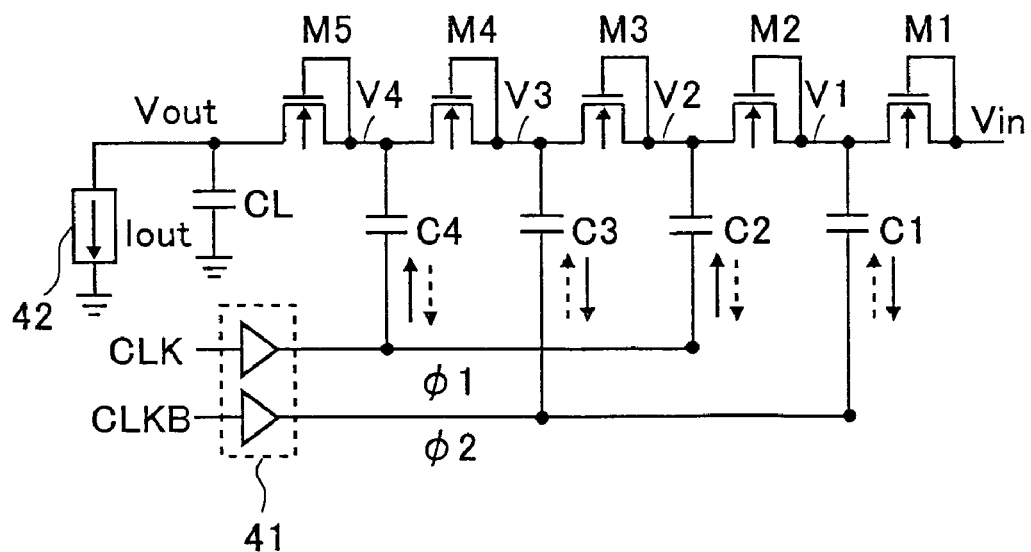
FIG. 4 is a circuit diagram of a charge pump device according to the embodiment of the present invention.
Figure 5:
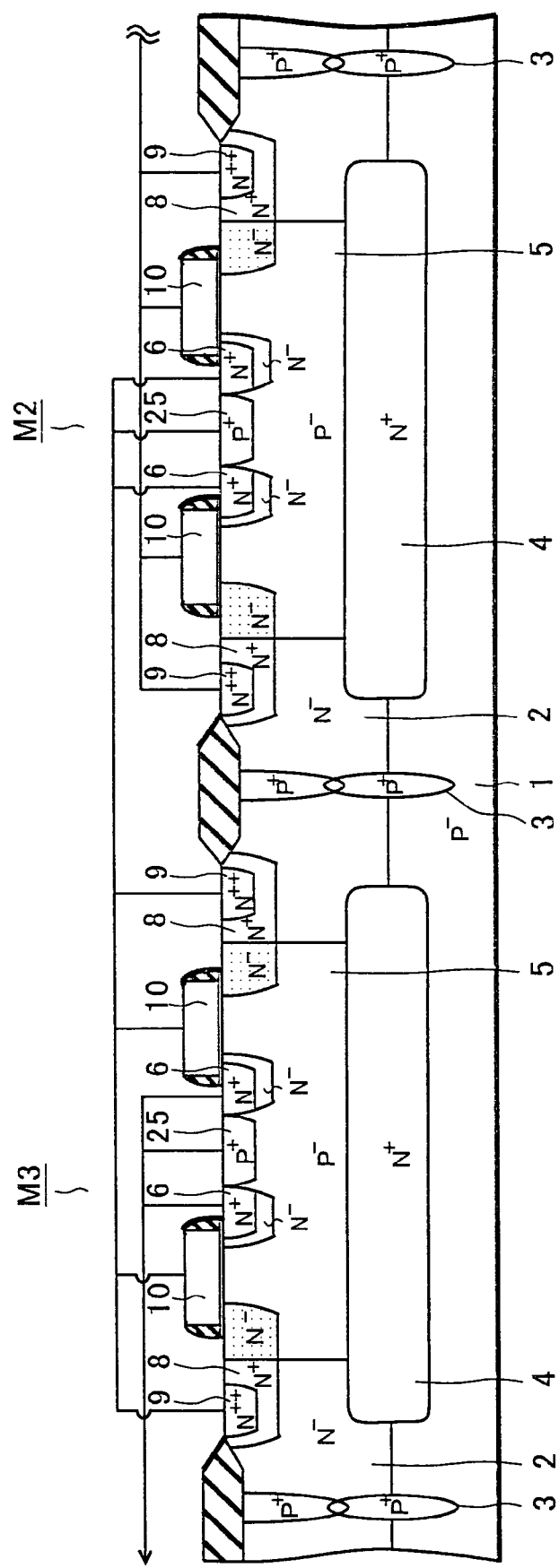
FIG. 5 is a cross-sectional view showing the charge pump device according to the embodiment of the present invention.

Next, with reference to FIGS. 3 to 5, detailed description will be given of a charge pump device using the N-channel MOS transistor which has been described with reference to FIGS. 1 and 2. FIG. 3 is a circuit diagram of a four-stage Dickson charge pump device. FIG. 4 is a circuit diagram of the four-stage Dickson charge pump device in the case where diode elements shown in FIG. 3 are replaced by MOS transistor elements. FIG. 5 is a cross-sectional view of a charge transfer MOS transistor in the charge pump device shown in FIG. 4.

First, the Dickson charge pump device will be described.

As shown in FIG. 3, diodes D1 to D5 are serially connected. C1 to C4 are coupling capacitors connected to connection points of the respective diodes D1 to D5. A CL is an output capacitor, and a CLK and a CLKB are input clock pulses reversed-phases to each other. Moreover, reference numeral 41 indicated by a dotted line is a clock driver to which the CLK and the CLKB are inputted, and reference numeral 42 indicated by a solid line is a current load. A power supply voltage is supplied to the clock driver 41. Accordingly, an output amplitude of clock pulses φ1 and φ2 outputted from the clock driver 41 is set to about Vdd. The clock pulse φ1 is supplied to the capacitors C2 and C4, and the clock pulse φ2 is supplied to the capacitors C1 and C3.

In a stable state, when a constant current Iout flows to the output, an input current to the charge pump device includes a current from an input voltage Vin and a current supplied from the clock driver. These currents are as follows when a charge/discharge current to a stray capacitance is ignored. Specifically, during a period of F1=High and F2=Low, an average current of 2Iout flows in directions indicated by the solid arrows in FIG. 3.

Moreover, during a period of F1=Low and F2=High, the average current of 2Iout flows in directions indicated by the broken line arrows in FIG. 3. All the average currents in a clock cycle are set to Iout. A boosting voltage Vout of the charge pump device in the stable state is expressed as below.

$$V_{out} = V_{in} - V_d + n(V_\phi' - V_1 - V_d) \quad \text{[Equation 1]}$$

Here, Vφ' is a voltage amplitude generated by the coupling capacitor along with a change in the clock pulse at each node. V1 is a voltage drop caused by an output current Iout, and Vin is an input voltage, which is normally set to 0V in plus boosting. Vd is a forward bias diode voltage, and n is the number of stages of pumping. Furthermore, V1 and Vφ' are expressed by the following equations.

$$V_1 = \frac{I_{out}}{f(C+C_s)} = \frac{2I_{out}T/2}{C+C_s} \quad \text{[Equation 2]}$$

$$V_\phi' = V_\phi \frac{C}{C+C_s} \quad \text{[Equation 3]}$$

Here, the C1 to C4 are clock coupling capacitors, Cs is a stray capacitance at each node, Vφ is a clock pulse amplitude, f is a clock pulse frequency, and T is a clock period. An output efficiency of the charge pump device is expressed by the following equation when the charge/discharge current flowing into the stray capacitance from the clock driver is ignored and Vin=Vdd is set.

$$\eta = \frac{V_{out}I_{out}}{(n+1)V_{dd}I_{out}} = \frac{V_{out}}{(n+1)V_{dd}} \quad \text{[Equation 4]}$$

As described above, in the charge pump device, boosting is performed by using the diodes as charge transfer devices and continuously transferring charges to the subsequent stages. However, in consideration for installation in a semiconductor integrated circuit device, from a viewpoint of process compatibility, it is easier to realize the charge pump device when MOS transistors are used than when pn junction diodes are used.

As shown in FIG. 4, as the charge transfer devices, MOS transistors M1 to M5 are used instead of the diodes D1 to D5. In this case, Vd is set to a threshold voltage Vth of the MOS transistors in the equation (1).

FIG. 5 shows charge transfer MOS transistors M2 and M3. A circuit configuration of this charge pump device is shown in FIG. 4. Note that the same constituent components as those shown in FIG. 1 described above are denoted by the same reference numerals, and detailed description thereof will be omitted.

A P-type substrate 1 and an N-type epitaxial layer 2 are divided into a plurality of island regions by P-type isolation regions 3. In the adjacent island regions, P-type diffusion layers 5 are formed as back gate regions, respectively. Moreover, in the P-type diffusion layers 5 and the N-type epitaxial layer 2 adjacent to the P-type diffusion layers 5, the charge transfer MOS transistors M2 and M3 are formed, respectively. A structure of a drain region formed so as to surround the P-type diffusion layer 5 is the same as that described above with reference to FIGS. 1 and 2.

In each of the charge transfer MOS transistors M2 and M3, as described above, an N-type diffusion layer 8 to be the drain region is disposed so as to surround the P-type diffusion layer 5 to be the back gate region. The P-type diffusion layer 5 and the N-type diffusion layer 8 partially overlap with each other. Moreover, the overlapping region becomes a low-concentration N-type diffusion region. By use of the structure described above, a distance between a drain and a source is shortened while achieving electric field relaxation in the drain region. Thus, an ON resistance value can be reduced. As a result, ON resistance values of the charge transfer MOS transistors M1 to M5 in the charge pump device are reduced. Thus, a large current charge pump device can be realized.

Note that, in this embodiment, the description has been given of the example of applying the transistors to the four-stage Dickson charge pump device. However, it is apparent that the number of stages thereof is not limited to four.

Moreover, although the description has been given of the case where the N-channel MOS transistors are used as the charge transfer MOS transistors, the embodiment of the present invention is not limited to the above case. For example, P-channel MOS transistors may be used. In a charge pump device for minus boosting, a connection relationship between a substrate and a source region in a charge transfer MOS transistor is reversed. Moreover, clock timing is also reversed.

Moreover, although the gate electrode and the drain region are commonly connected in the charge transfer MOS transistors M1 to M5, the embodiment of the present invention is not limited to the above case. For example, the embodiment of the present invention is also applicable to a charge pump device adopting a circuit configuration in which a high voltage is applied between a gate and the source when the charge transfer MOS transistors M1 to M5 are turned ON. Besides the above, various changes can be made without departing from the scope of the embodiment of the present invention.

In the embodiment of the present invention, a P-type back gate diffusion layer is formed in an N-type epitaxial layer. Meanwhile, in the epitaxial layer, an N-type drain diffusion layer is formed so as to partially overlap with the back gate diffusion layer and the formation region. By use of the structure described above, a distance between a drain and a source is shortened. Thus, an ON resistance value can be reduced.

Moreover, in the embodiment of the present invention, the region where the drain diffusion layer and the back gate diffusion layer overlap with each other is formed so as to be an N-type diffusion region. By use of the structure described above, the drain diffusion layer has a concentration gradient such that an impurity concentration thereof is lowered with getting toward the source diffusion layer side. Moreover, even if the element formation region is reduced, withstand pressure characteristics can be maintained.

Moreover, in the embodiment of the present invention, the drain diffusion layer is circularly formed so as to surround the back gate diffusion layer. By use of the structure described above, the drain diffusion layer can be efficiently disposed and a large current can be realized while reducing the element formation region.

Moreover, in the embodiment of the present invention, a charge pump circuit is formed by use of an N-channel MOS transistor. By use of the circuit configuration described above, reduction in an ON resistance value of a charge transfer MOS transistor makes it possible to realize a large current.

What is claimed is:

1. A semiconductor device comprising:
   a one conductivity type semiconductor substrate;
   an opposite conductivity type epitaxial layer laminated on the semiconductor substrate;
   a gate oxide film and a gate electrode, which are formed on the epitaxial layer;
   an opposite conductivity type buried diffusion layer formed across the semiconductor substrate and the epitaxial layer;
   a one conductivity type back gate diffusion layer which is formed in the epitaxial layer and overlaps with the buried diffusion layer at a bottom of the back gate diffusion layer;
   an opposite conductivity type drain diffusion layer which is formed in the epitaxial layer, at least partially overlaps with the back gate diffusion layer, and allows the overlapping region to be an opposite conductivity type diffusion region;
   an opposite conductivity type source diffusion layer formed in the back gate diffusion layer;
   a drain electrode connected to the drain diffusion layer; and
   a source electrode connected to the source diffusion layer.

2. The semiconductor device according to claim 1, wherein the drain diffusion layer is circularly formed so as to surround the back gate diffusion layer.

3. The semiconductor device according to claim 2, wherein a drain contact diffusion layer is circularly formed in the drain diffusion layer.

4. The semiconductor device according to any one of claims 1 and 2, further comprising:
   a one conductivity type back gate contact diffusion layer which is formed in the back gate diffusion layer and positioned in the vicinity of the source diffusion layer,
   wherein the source electrode is connected to the source diffusion layer and the back gate contact diffusion layer.

* * * * *